United States Patent
Fan et al.

(10) Patent No.: US 6,638,077 B1
(45) Date of Patent: Oct. 28, 2003

(54) SHIELDED CARRIER WITH COMPONENTS FOR LAND GRID ARRAY CONNECTORS

(75) Inventors: Zhineng Fan, Santa Clara, CA (US); Ai D. Le, Sunnyvale, CA (US); Che-Yu Li, Ithaca, NY (US)

(73) Assignee: High Connection Density, Inc., Sunnyvale, CA (US)

( * ) Notice: Subject to any disclaimer, the term of this patent is extended or adjusted under 35 U.S.C. 154(b) by 2 days.

(21) Appl. No.: 09/791,342

(22) Filed: Feb. 26, 2001

(51) Int. Cl.[7] ................................................ H01R 9/09
(52) U.S. Cl. ............................. 439/66; 439/91; 439/607
(58) Field of Search ............................ 439/66, 65, 91, 439/92, 591, 71, 607, 608, 609, 610; 361/760, 795; 251/532, 700

(56) References Cited

U.S. PATENT DOCUMENTS

| | | | |
|---|---|---|---|
| 5,530,288 A | 6/1996 | Stone | 438/106 |
| 5,599,193 A * | 2/1997 | Crotzer | 439/66 |
| 5,770,476 A | 6/1998 | Stone | 257/700 |
| 5,810,607 A * | 9/1998 | Shih et al. | 439/66 |
| 5,991,161 A * | 11/1999 | Samaras et al. | 361/760 |
| 6,097,609 A * | 8/2000 | Kabadi | 361/760 |
| 6,247,939 B1 * | 6/2001 | Bestul et al. | 439/66 |
| 6,312,266 B1 * | 11/2001 | Fan et al. | 439/91 |
| 6,417,556 B1 * | 7/2002 | Long et al. | 257/532 |

* cited by examiner

Primary Examiner—Alexander Gilman
(74) Attorney, Agent, or Firm—Salzman & Levy

(57) ABSTRACT

A shielded carrier with electrical components is provided, resulting in LGA interposer connectors with improved electrical performance and enhanced functionality. The carrier includes components such as resistors and capacitors on and/or in the carrier. The components are preferably of the surface mount variety or are imbedded within the carrier, due to the inherent lower profile of these form factors. Decoupling capacitors and terminating resistors are two examples of components that may improve performance.

21 Claims, 13 Drawing Sheets

SHIELDED CARRIER WITH COMPONENTS FOR LAND GRID ARRAY CONNECTORS

RELATED PATENT APPLICATIONS

This application is related to U.S. Pat. No. 6,264,476, issued to Li et al. for WIRE SEGMENT BASED INTERPOSER FOR HIGH FREQUENCY ELECTRICAL CONNECTION, which is based on application Ser. No. 09/457,776, filed Dec. 9, 1999; to U.S. Pat. No. 6,312,266, issued to Fan et al. for CARRIER FOR LAND GRID ARRAY CONNECTORS, which is based on application Ser. No. 09/645,860, filed Aug. 24, 2000; to U.S. patent application Ser. No. 09/772,641, filed Jan. 31, 2001; and to U.S. patent application Ser. No. 09/866,434, filed May 29, 2001, which is a non-provisional application based on provisional application Ser. No. 60/227,689, filed Aug. 24, 2000, all of which are hereby incorporated by reference.

FIELD OF THE INVENTION

The present invention relates to electrical connectors and, more particularly, to electrical connectors for interconnecting electrical circuit members such as printed circuit boards, circuit modules, or the like, which may be used in information handling system (computer) or telecommunications environments.

BACKGROUND OF THE INVENTION

The current trend in design for connectors utilized in high speed electronic systems is to provide high electrical performance, high density and highly reliable connections between various circuit devices, which form important parts of those systems. The system may be a computer, a telecommunications network device, a handheld "personal digital assistant", medical equipment, or any other electronic equipment.

One way high electrical performance is manifested is in improved signal integrity. This can be accomplished by providing the interconnections with shielding that helps them to more closely match a desired system impedance. High reliability for such connections is essential due to potential end product failure, should vital misconnections of these devices occur. Further, to assure effective repair, upgrade, and/or replacement of various components of the system (e.g., connectors, cards, chips, boards, modules, etc.), it is also highly desirable that, within the final product, such connections be separable and reconnectable in the field. Such a capability is also desirable during the manufacturing process for such products in order to facilitate testing, for example.

A land grid array (LGA) is an example of such a connection in which each of two primarily parallel circuit elements to be connected has a plurality of contact points, arranged in a linear or two-dimensional array. An array of interconnection elements, known as an interposer, is placed between the two arrays to be connected, and provides the electrical connection between the contact points or pads.

LGA interposers described in the prior art are implemented in many different ways. Many of these were described and compared in one of the referenced copending U.S. patent applications. Compared to the prior art, the inventive LGA carriers described in that referenced patent application significantly improve the reliability of LGA carriers. Another of the referenced copending U.S. patent applications teaches the mechanical and reliability improvement of the carriers through the inclusion of features such as retentive members in openings, and layers of spacers located above and below the planer surfaces of the carriers. But to improve the electrical performance, further invention is necessary.

Yet another referenced copending U.S. patent application teaches that the carriers can be improved electrically such as by metallizing openings, including conductive layers, and further including pairs of shorter length contact members, thereby creating a shielded carrier. The recommendations of materials and processes of the aforementioned patent applications are also important to the improved manufacturability and lower cost of the instant invention.

One way to further enhance the electrical performance and to provide additional functionality to LGA connectors, and particularly to those described hereinabove, is to provide electrical components such as, but not limited to, resistors and capacitors on and/or in the carrier. It is preferable that the components be of the surface mount or of the imbedded variety within the carrier due to the inherent lower profile of these form factors. Depending on the quantity and properties of components in a given application, a carrier with imbedded components may be less expensive to produce.

Decoupling capacitors and terminating resistors are two examples of components that may improve performance. The decoupling capacitors may be used from a signal connection to a reference voltage, or even between reference voltages. A reference voltage is a DC level typically used as a power supply voltage for a given circuit. A circuit may have several difference reference voltages. Some common values are 5.0 volts, 3.3 volts, 3.0 volts, 2.5 volts, 1.8 volts and 0 volts, which is frequently referred to as "ground". For the case of terminating resistors, not only do they improve the electrical performance of circuits operating at transmission line frequencies, but they save component real estate on the adjacent circuit members. It is only recently that interconnections with high electrical integrity and functionality for use in high speed, high density electronic systems have been required.

The use of surface mount components on printed circuit structures is widely understood. The use of imbedded components within printed circuit structures may not be as well understood. This technology has been implemented by companies such as Ohmega Technologies, Inc. of Culver City, Calif. and Gould Electronics, Inc. of East Lake, Ohio.

U.S. Pat. Nos. 5,530,288 and 5,770,476, both issued to Stone for PASSIVE INTERPOSER INCLUDING ONE PASSIVE ELECTRONIC COMPONENT, have elements that appear similar to those of various embodiments of the invention. However, further study shows significant differences. STONE discloses a printed circuit structure for passive electronic components, including imbedded ones, that are incompatible with fluorocarbon-based (e.g., PTFE) printed circuit boards. The STONE structure is not a connector carrier and cannot support a plurality of contact members for creating an LGA connector as does the present invention.

What has not yet been disclosed is a carrier with components that would result in LGA interposer connectors with improved electrical performance and additional functionality, constituting a significant advancement in the art.

It is, therefore, an object of the invention to enhance the electrical connector art.

It is another object of the invention to provide a carrier for land grid array connectors with components.

It is an additional object of the invention to provide a carrier for land grid array connectors with imbedded components.

SUMMARY OF THE INVENTION

The present invention provides a shielded carrier with electrical components, resulting in LGA interposer connectors with improved electrical performance and enhanced functionality. The carrier includes a plurality of components such as, but not limited to, resistors and capacitors on and/or in the carrier. It is preferable that the components be of the surface mount variety or imbedded within the carrier, due to the inherent lower profile of these form factors. Decoupling capacitors and terminating resistors are two examples of components that may improve performance. The decoupling capacitors may be used from a signal connection to a reference voltage, or even between reference voltages. For the case of terminating resistors, not only do they improve the electrical performance of circuits operating at transmission line frequencies, but they also save component real estate on the adjacent circuit members.

BRIEF DESCRIPTION OF THE DRAWINGS

A complete understanding of the present invention may be obtained by reference to the accompanying drawings, when taken in conjunction with the detailed description thereof and in which:

FIG. 2b is a cross section, enlarged side view of a preferred carrier member demonstrating the mechanical relationships of the connector shown in FIG. 2a;

FIG. 2d is an enlarged perspective view of a contact member of the connector shown in FIG. 2a;

FIG. 2e is a cross section, enlarged side view demonstrating the shielding aspects of the connector shown in FIG. 2a;

DETAILED DESCRIPTION OF THE PREFERRED EMBODIMENT

Generally speaking, the present invention is a shielded carrier with components, resulting in LGA interposer connectors with improved electrical performance and enhanced functionality.

Figure 1A:
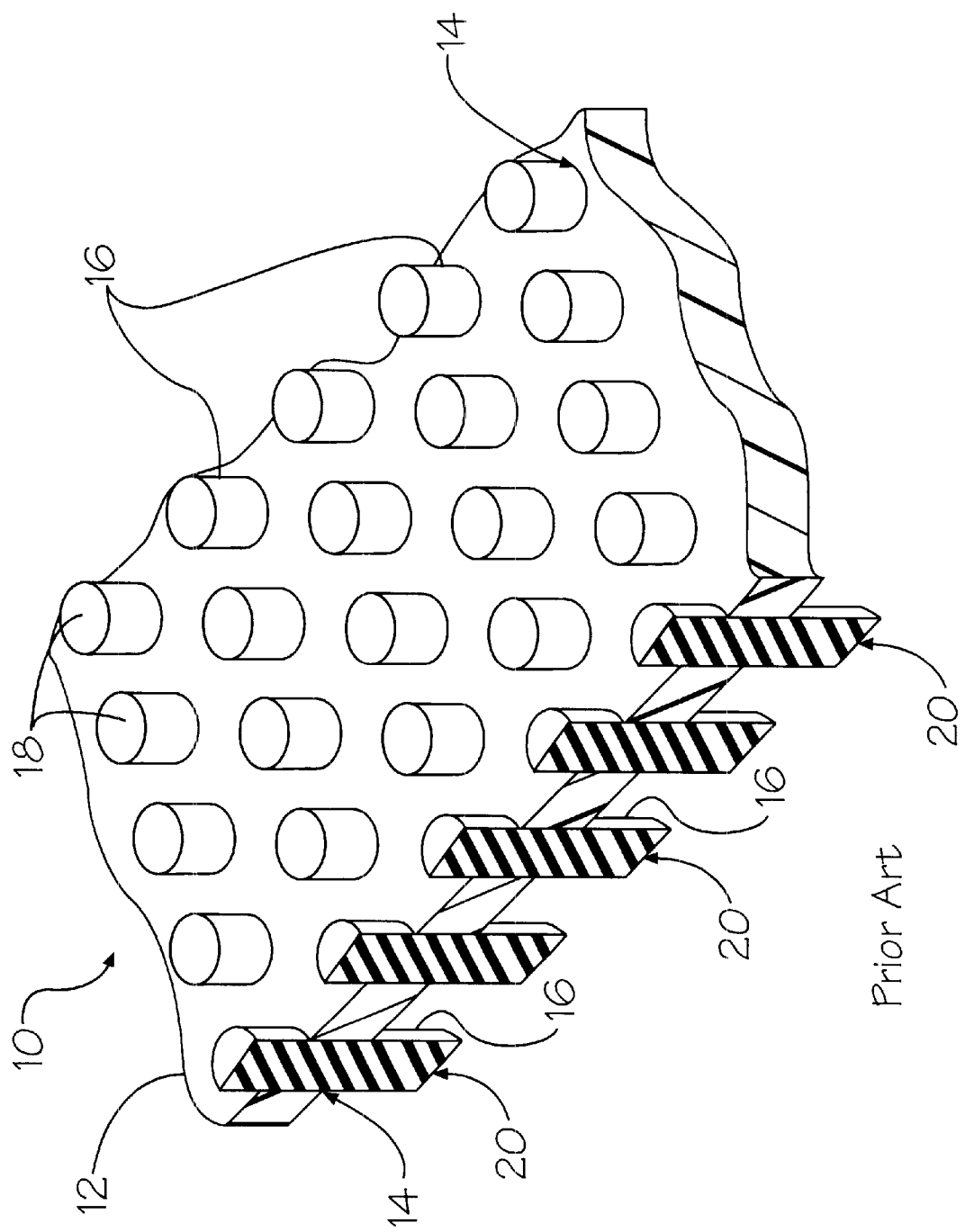
FIG. 1a is a partial perspective view of an electrical connector in accordance with the prior art.
Figure 1B:
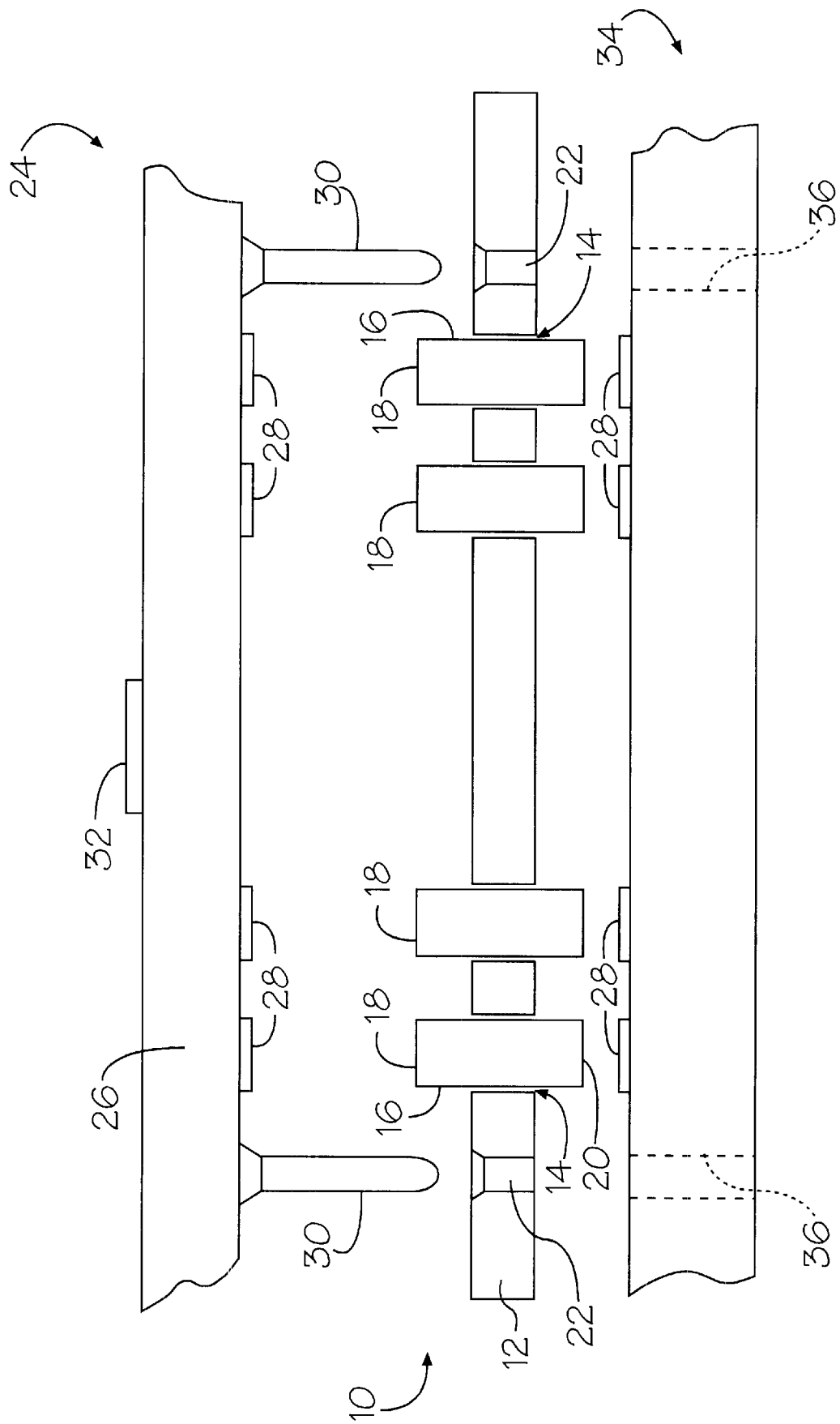
FIG. 1b is a cross section, enlarged side view of the prior art connector shown in FIG. 1a, the connector being located between and in alignment with a pair of circuit members for providing interconnection therebetween.

Referring first to FIGS. 1a and 1b, there are shown perspective and cross sectional views, respectively, of a connector 10 of the prior art for electrically interconnecting a pair of electrical circuit members 24 and 34. Examples of circuit members suitable for interconnection by connector 10 include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, conductive pins, etc.), which may form part thereof. Such modules are also well known in the art and further description is not believed necessary.

Connector 10 includes a common, electrically insulative carrier member 12 having a plurality of internal apertures or openings 14. The openings 14 are typically cylindrical in shape. Resilient contact members 16 are located so as to substantially occupy a respective opening 14 in carrier member 12.

Each opposing end 18 and 20 of each contact member 16 is designed for electrically contacting respective circuit members. As stated, these circuit members may be printed circuit boards 34 (FIG. 1b) having flat conductive pads (e.g., copper terminals) 28 located on an upper surface thereof. These circuit members may also comprise a circuit module 24 including a substrate 26 having a plurality of semiconductor elements 32 thereon. Corresponding thin, flat, copper conductive pads 28 can be located on a bottom, external surface on circuit module 24. Understandably, the conductive pads 28 are electrically coupled to corresponding circuitry, which forms part of the respective electrical circuit members. These pads 28 may provide signal, power or ground connections, depending on the operational requirements of the respective circuit member.

Connector 10 is designed for positioning between opposing circuit members 24 and 34, and for being aligning therewith. Such alignment is facilitated by positioning the carrier member 12, which may also include alignment openings 22.

Each resilient contact member 16 is compressed during engagement to form the appropriate interconnection between corresponding pairs of conductive pads 28.

Referring now to FIGS. 2a–2e, there is shown a connector 40 of the present invention for electrically interconnecting a pair of electrical circuit members 24 and 34. Examples of suitable circuit members include printed circuit boards, circuit modules, etc.

Connector 40 includes a carrier member 42 having a plurality of internal openings 50, 51. In contrast to the prior art carrier member 12 (FIG. 1b), openings 50, 51 (FIG. 2e) in carrier member 42 are electrically conductive and are electrically connected to first shielding layer 57 and/or second shielding layer 58. In a preferred embodiment, carrier member 42 (FIG. 2b) consists of an upper section 44, upper spacers 52, a lower section 46, and lower spacers 54, with a retention layer 48 between the upper and lower sections 44, 46. In this embodiment, the openings 50, 51 are cylindrical in shape. It should be understood, however, that other geometric shapes can be used, as required, for the openings 50, 51 and corresponding contact members 16a–16e. The conductive portions of carrier 42 are intentionally not included in FIG. 2b for clarity purposes, but can be seen in FIG. 2e.

Retention layer 48 (FIG. 2c) has a plurality of smaller openings 45 formed by a plurality of retention segments 47 that are created by the removal of a portion of retention layer 48 and the segmentation of the remaining material within a larger opening 50 in carrier member 42. In one example, each larger opening 50 contains four retention segments 47 that form smaller circular opening 45. The specific dimensions of each of the elements of this invention can be varied to produce the desired amount of retention force on contact members 16a–16e (not shown in FIG. 2c).

Figure 2A:
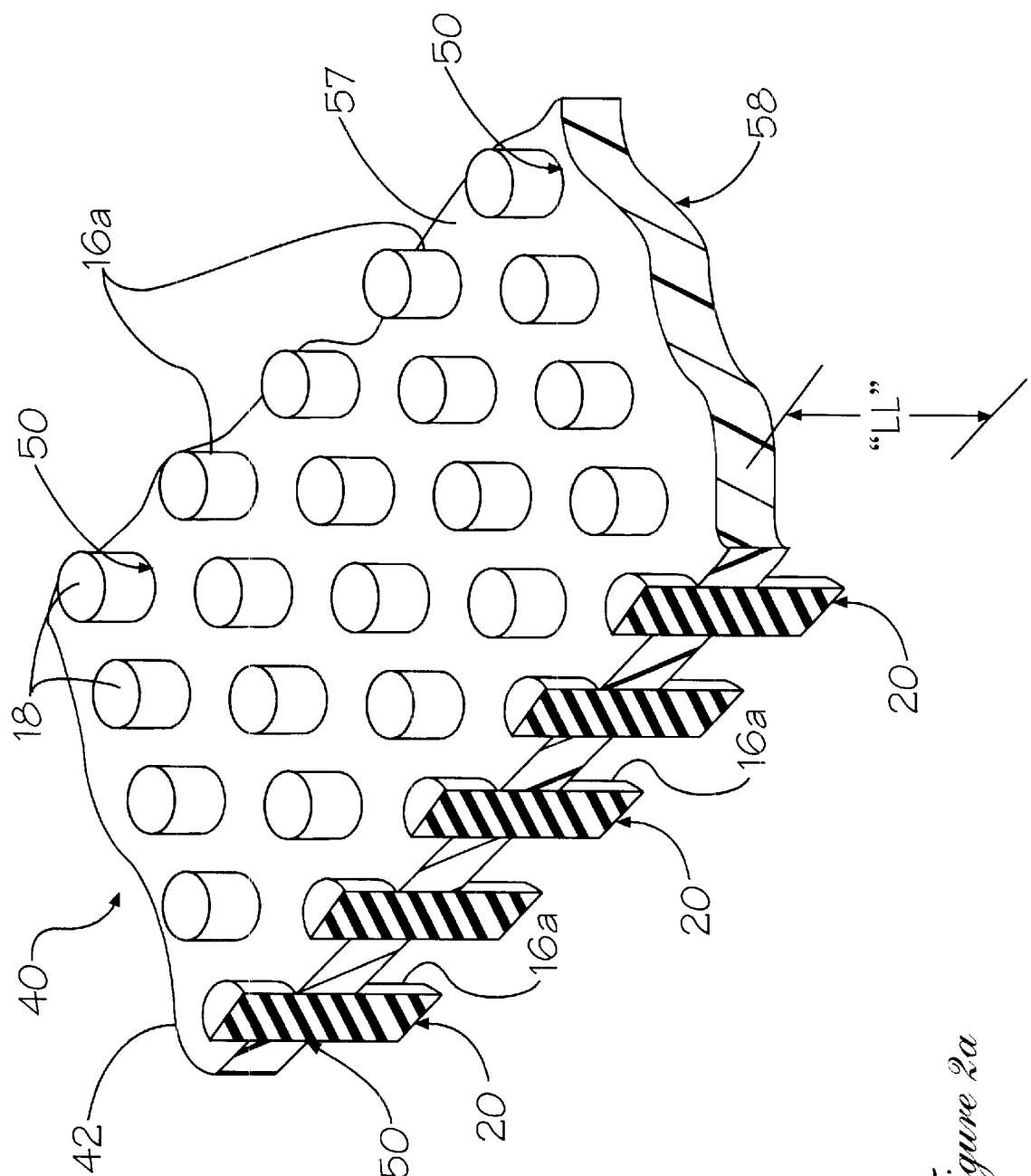
FIG. 2a is a partial perspective view of an electrical connector in accordance with one embodiment of the present invention.
Figure 2B:
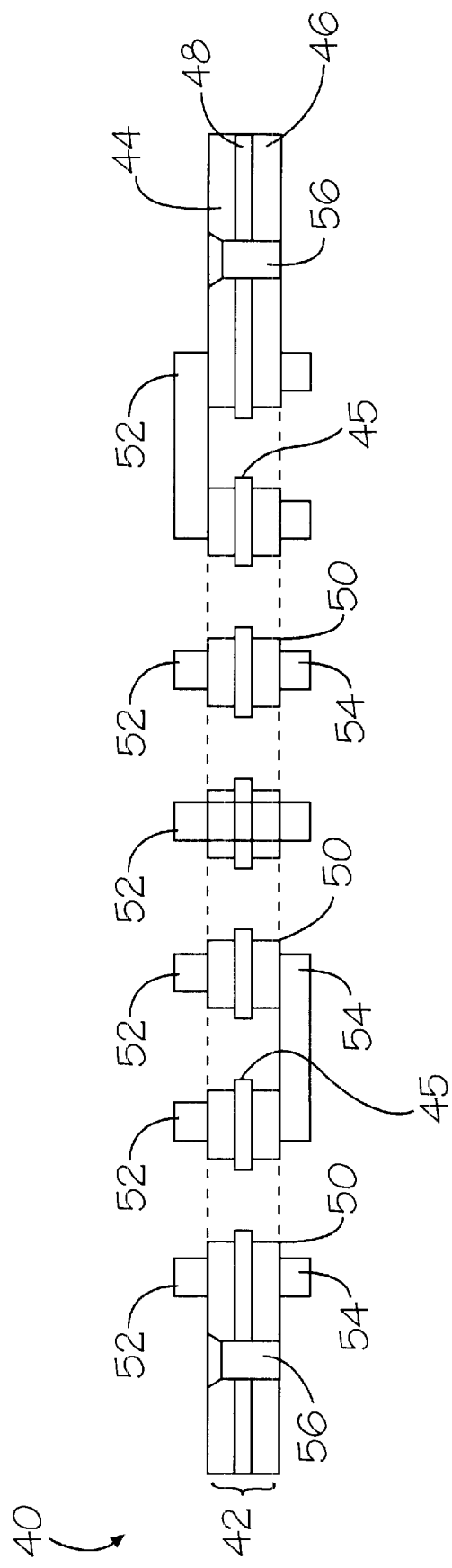
Figure 2C:
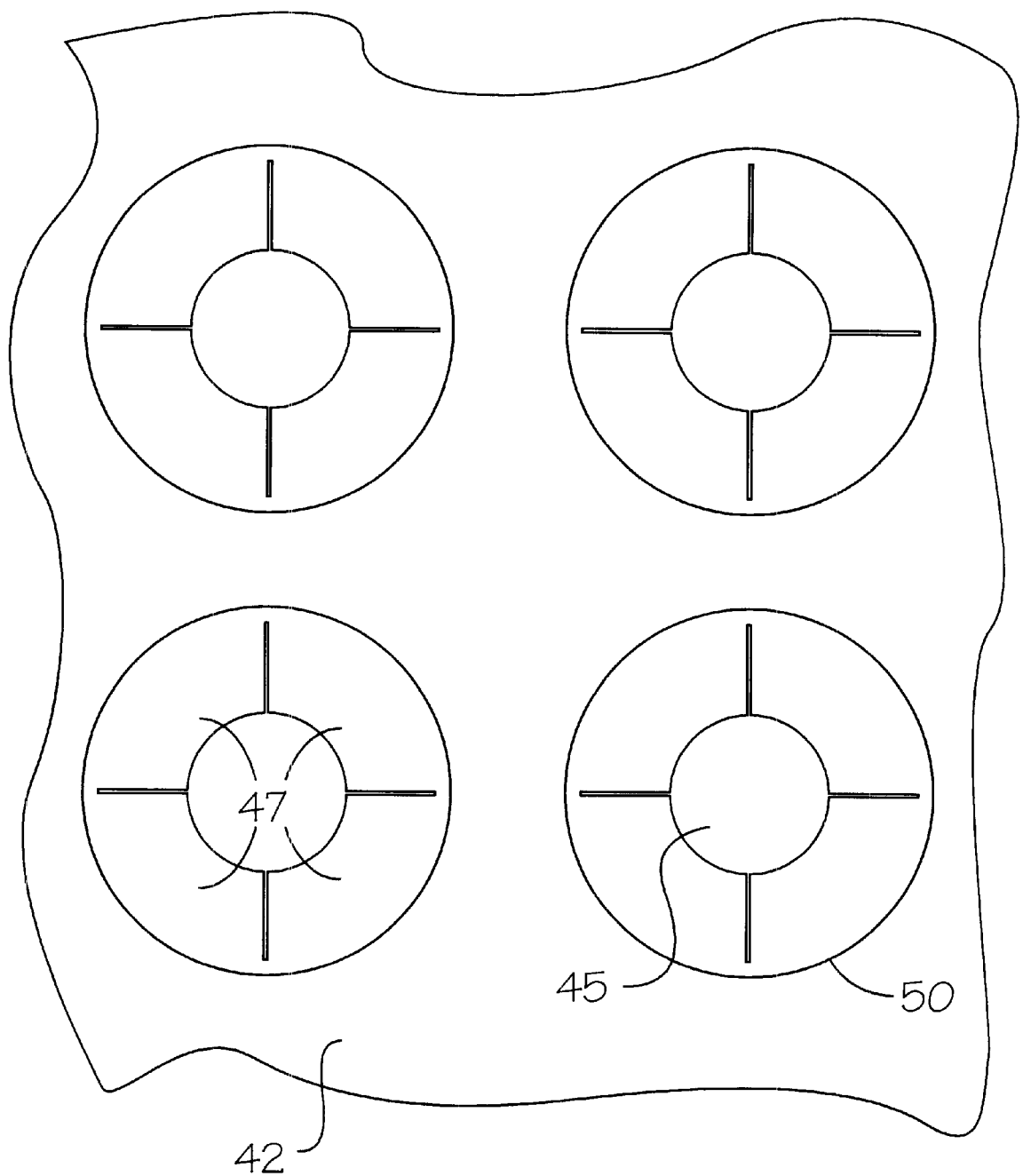
FIG. 2c is an enlarged top view of the carrier shown in FIG. 2b.
Figure 2D:
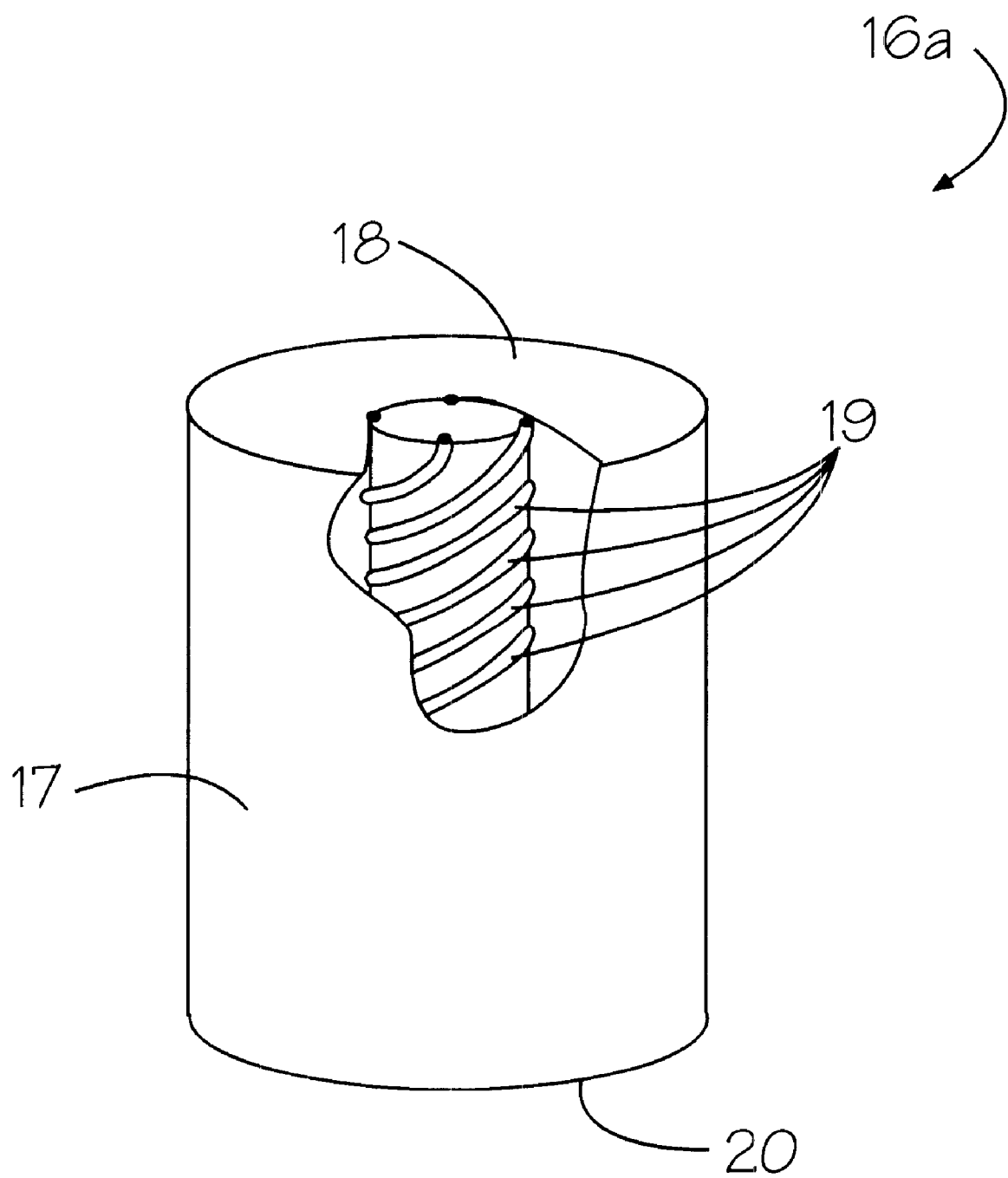

Referring now to FIG. 2d, there is shown a perspective view of an individual contact member 16a, comprising conductive opposing ends 18 and 20, conductors 19, and insulative side 17, which ensures electrical isolation from conductive openings 50. Contact members 16a, 16b, and 16c are all physically identical; only their intended function varies. Contact members 16d and 16e are similar, but slightly shorter.

Figure 2E:
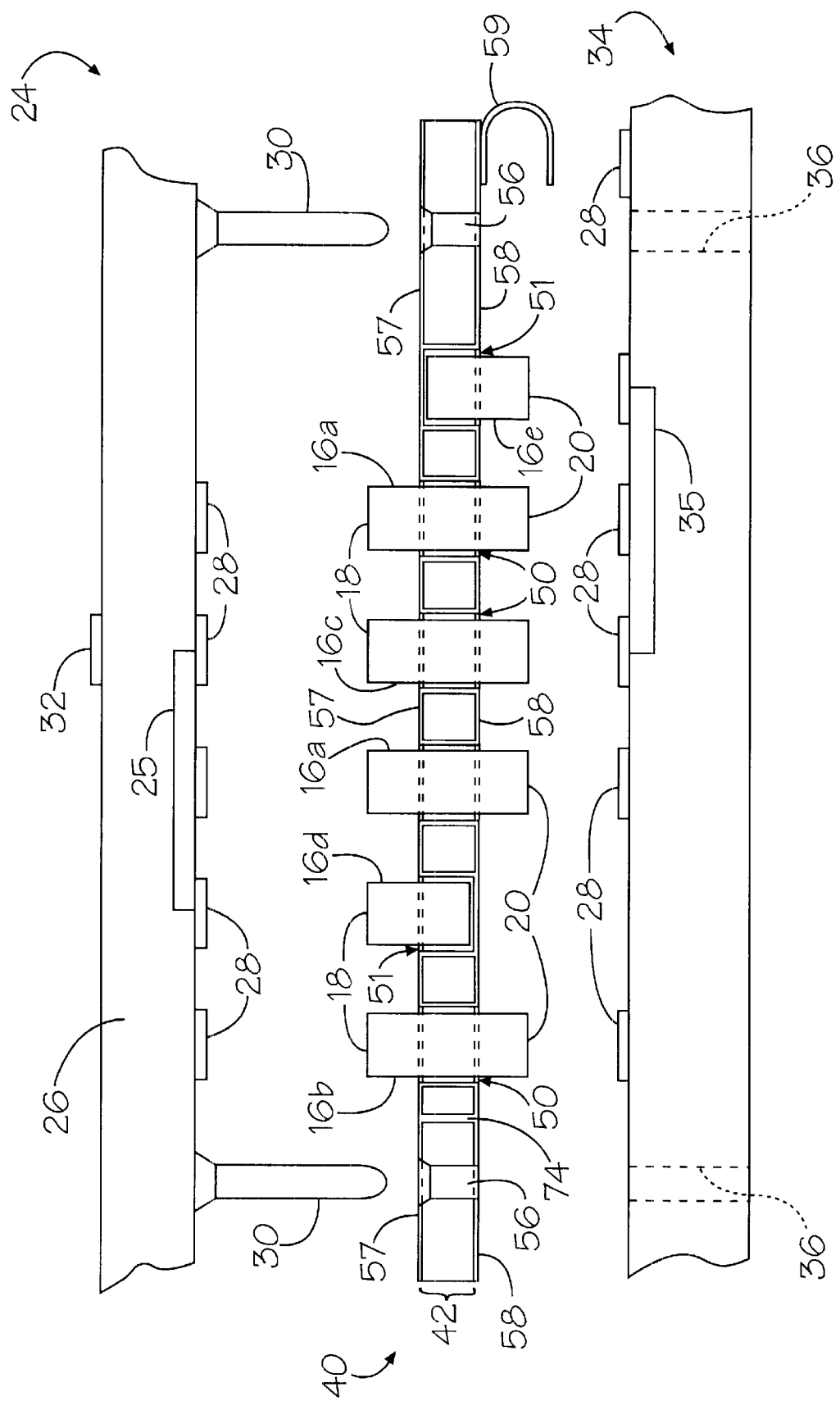

Referring now to FIG. 2e, there is shown a cross sectional view of connector 40 to illustrate the shielding aspects of carrier member 42. As aforementioned, in contrast to the prior art carrier member 12 (FIG. 1b), openings 50, 51 in carrier member 42 are electrically conductive and are electrically connected to first shielding layer 57 and/or second shielding layer 58. They are cylindrical in shape.

Each contact member 16a–16c, 16d–16e is located so as to substantially occupy an opening 50, 51, respectively, in carrier member 42. Contact members 16a–16e are preferably of a construction and composition as taught in copending U.S. patent application, Ser. No. 09/457,776, especially in FIGS. 2 and 3a–3e thereof. It is important that the sides 17 of the contact members 16a–16e that are not at the same electrical potential as the shielding layers 57, 58 and openings 50, be insulative to prevent shorting between the conductive portions of the contact members 16a–16e and the conductive openings 50. Upper and lower spacers 52, 54 (FIG. 2b) also help to ensure that the conductive portions of contact members 16a–16e will not short to first and second shielding layers 57, 58 located on the top and bottom surface, respectively, of carrier member 42. Upper and lower spacers 52, 54 also provide mechanical support behind respective shorter contact members 16d, 16e (FIG. 2e) to prevent damage such as cracking and/or peeling to the shielding layers 57, 58 of carrier member 42.

Openings 51 differ from openings 50 in that, instead of being completely open internally, they are enclosed at one end by one of the shielding layers 57, 58. They are intended to house one of the shorter contact members 16d–16e for use as described below.

For any given application, an individual contact member may be used to provide a signal, power, or ground interconnection. In the example shown in FIG. 2e, contact members 16a are used for signals and contact members 16b are used for power. Shorter contact member 16d is used to connect second shielding layer 58 to a pad 28 on circuit member 24 at ground potential; the other shorter contact member 16e is used to connect first shielding layer 57 to a pad 28 on circuit member 34 also at ground potential. Contact member 16c is then used to connect the grounds in circuit members 24 and 34 through connecting traces 25 and 35, respectively.

It should be noted that contact members 16d, 16e , intended to contact one of the shielding layers 57, 58, are a different length than are other contact members. This is to ensure that opposing ends 18 and 20 of all contact members are at a uniform height to properly mate with conductive pads 28 of circuit members 24 and 34. Even though the shielding layers 57, 58 in the present example are connected to ground, in some applications it may be desirable to connect them to another reference voltage or to segment the shielding layers. Certain sections can be connected to ground and others connected to other reference voltages. The inclusion of vias 74 in carrier 42 facilitates wiring and may provide improved shielding performance.

Conductive openings 50 can also improve the electrical quality of power conductors by lowering the inductance of the power-carrying contact members 16b.

Carrier member 42 may also include additional commoning means 59 to further improve the shielding by providing an additional return path. In this example the additional path is implemented as a connection to a pad 28 on circuit member 34.

Although two shielding layers are shown for purposes of disclosure, a carrier with one or even three or more shielding layers can also be used, depending on specific system electrical requirements. Still referring to FIG. 2e, as with the prior art, each opposing end 18 and 20 of contact member 16a–16e is designed for electrically contacting respective circuit members. These circuit members may be printed circuit boards 34 having flat conductive pads (e.g., copper terminals) 28 located in an upper surface thereof. These circuit members may also comprise a circuit module 24 including a substrate 26 having a plurality of semiconductor elements 32 thereon and corresponding flat conductive pads (e.g., thin copper elements) 28 located on a bottom, external surface. The conductive pads 28 are electrically coupled to corresponding circuitry, which forms part of the respective electrical circuit members. These pads 28 may provide signal, power or ground connections, depending on the operational requirements of the respective circuit member. It is preferred that conductive pads 28 be plated with a layer of metal (e.g., gold) to ensure reliable interconnection to connector 40.

Connector 40 is positioned between opposing circuit members 24 and 34, and is aligned therewith. Such alignment is facilitated by positioning the carrier member 42, which also includes alignment openings 56.

Alignment of the circuit members 24 and 34 relative to interim connector 40 may be provided utilizing a pair of protruding pins 30 which extends from one of the circuit members (e.g., module 24). These pins are aligned with and positioned within corresponding openings 56 within carrier member 42 and openings 36 (shown in phantom) within the other circuit member 34. It should be understood that other means of alignment are readily possible, including pins extending from opposing surfaces of carrier member 42 for inversion within corresponding openings within the respective circuit members. To adjust for tolerancing, one of the openings 56 within connector 40 may be of an elongated configuration, forming a slot, for example.

Each contact member 16a–16e is compressed during engagement to form the appropriate interconnection between corresponding pairs of conductive pads 28.

Figure 3:
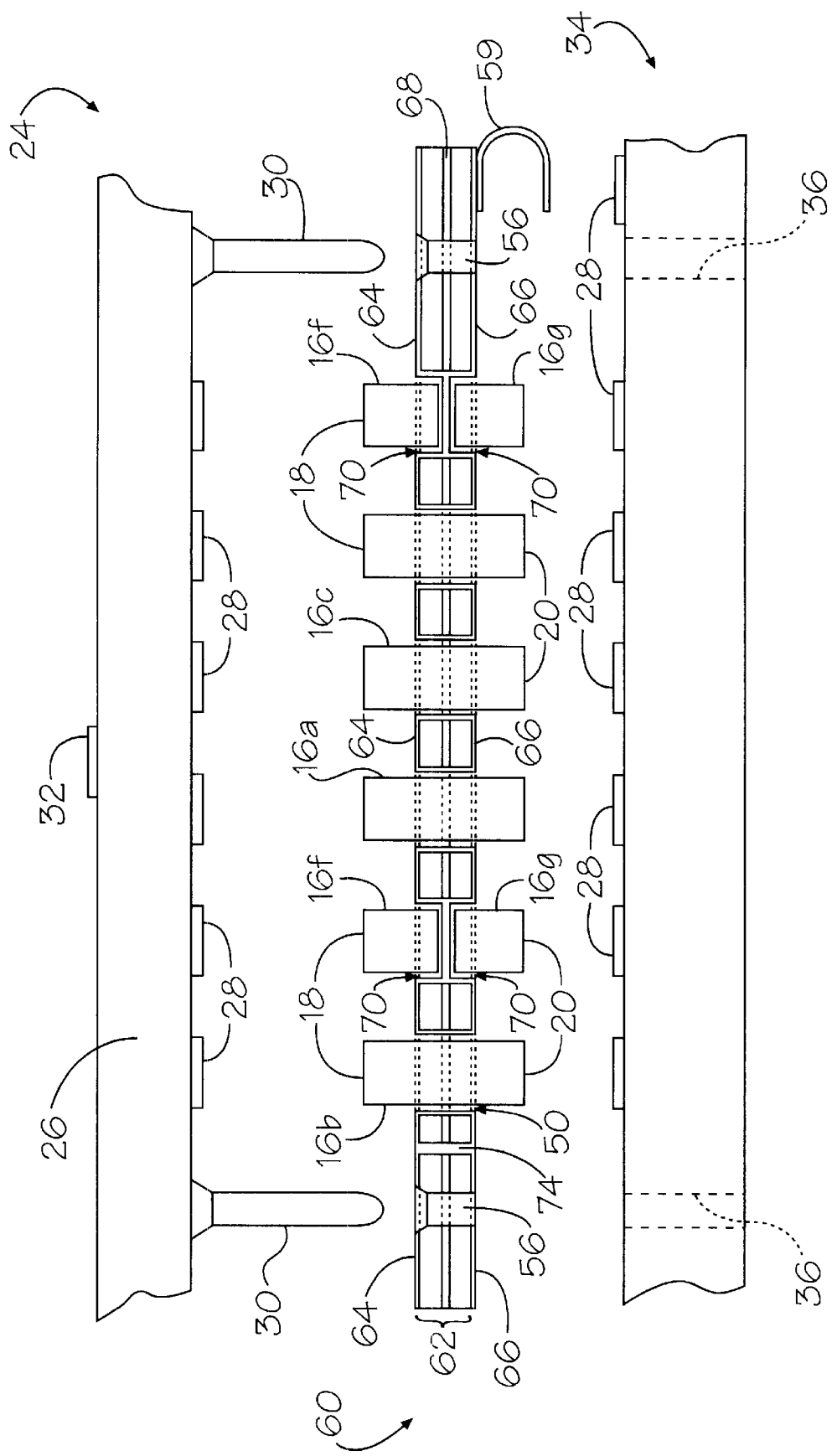
FIG. 3 is a side view of a carrier for an electrical connector in accordance with a second embodiment of the present invention.

Referring now to FIG. 3, there is shown a cross sectional view of a carrier member 62 to be used as part of a connector 60 in accordance with an alternate embodiment of the invention. The primary purpose for using carrier member 62 over prior art carriers is the same as for carrier member 42 (FIGS. 2b, 2e): to provide a shielded carrier member for an LGA connector for electrically interconnecting a pair of electrical circuit members 24 and 34.

Connector 60 includes a carrier member 62 having a plurality of internal openings 50, 70. As in the first embodiment (FIGS. 2a–2e), openings 50, 70 are electrically conductive; they are electrically connected to an even greater number of shielding layers. For purposes of disclosure, three shielding layers 64, 66 and 68 are included. First shielding layer 64 and second shielding layer 66 are on external surfaces, as in the previous embodiment, but third shielding layer 68 is located internally. Again for simplicity, carrier member 62 is shown as a unified structure without retentive features, but could easily consist of multiple upper and lower sections and retentive layers as previously described. Also, features such as upper and lower spacers are not included for clarity purposes. In this example the openings 50, 70 are again cylindrical.

Each contact member 16a–16c and 16f–16g is located so as to substantially occupy an opening 50 and 70, respectively, in carrier member 62. Contact members 16a–16c and 16f–16g are: preferably of a construction and composition as taught in copending U.S. patent application, Ser. No. 09/457,776, especially in FIGS. 2 and 3a–3e thereof. It is important that the sides 17 of the contact members 16a–16c that are not at the same electrical potential as the shielding layers 64, 66, 68 and openings 50, be insulative to prevent shorting between the conductive portions of the contact members 16a–16c and the conductive openings 50. Upper and lower spacers 52, 54, as shown in FIG. 2b, also help to ensure that the conductive portions of contact members 16a–16c will not short to shielding layers 64, 66 located on the top and bottom respective surfaces of carrier member 62.

For any given application, an individual contact member may be used to provide a signal, power, or ground interconnection. In the example shown in FIG. 3, contact members 16a are used for signals, contact members 16b are used for power, and contact members 16c are used for ground. In this embodiment, for purposes of disclosure, shielding layers 64, 66, 68 and conductive openings 50, 70 are electrically referenced to ground. Shorter contact members 16f are used to connect the carrier shielding through third shielding layer 68 to pads 28 of circuit member 24 while the other shorter contact members 16g are used to connect the carrier shielding through third shielding layer 68 to pad 28 of circuit member 34. Contact member 16c and connecting traces 25 and 35 (FIG. 2e) are no longer required to interconnect the carrier shielding to circuit members 24 and 34.

It should be noted again that contact members 16f, 16g are a different length from that of other contact members to ensure that opposing ends 18 and 20 of all contact members are a uniform height so as to mate properly with conductive pads 28 of circuit members 24 and 34.

Even though the three shielding layers 64, 66, 68 are connected to ground, in some applications it may be desirable to connect them to another reference voltage or to segment the layers and connect certain sections to ground and others to other reference voltages. The inclusion of vias 74 in carrier 62 facilitates wiring and may provide improved shielding performance.

Conductive openings 50 can also improve the electrical quality of power conductors by lowering the inductance of the power-carrying contact members 16b.

Carrier member 62 may also include additional commoning means 59 to further improve the shielding by providing an additional return path. In this example an additional path is implemented as a connection to a pad 28 on circuit member 34. Another option is to use protruding pins 30 and openings 56, which are primarily intended to be used for alignment purposes, as an additional return path. openings 56 could be made conductive just like openings 16a–16f, and pins 30 could be electrically connected to circuit member 24 and possibly made in the form of a compliant fit pin to provide a better connection to the openings 56.

As with the prior art, each opposing end 18 and 20 of contact member 16a–16c, 16f–16g is designed for electrically contacting respective circuit members. These circuit members may be printed circuit boards 34 having flat conductive pads (e.g., copper terminals) 28 located in an upper surface thereof. These circuit members may also comprise a circuit module 24 including a substrate 26 having a plurality of semiconductor elements 32 thereon and corresponding flat conductive pads (e.g., thin copper elements) 28 located on a bottom, external surface. The conductive pads 28 are electrically coupled to corresponding circuitry, which forms part of the respective electrical circuit members. These pads 28 may provide signal, power or ground connections, depending on the operational requirements of the respective circuit member. It is preferred that conductive pads 28 be plated with a layer of metal (e.g., gold) to ensure reliable interconnection to connector 60.

Connector 60 is positioned between opposing circuit members 24 and 34, and is aligned therewith. Such alignment is facilitated by placing the carrier member 62, which also includes alignment openings 56. Alignment of the circuit members 24 and 34 relative to interim connector 60 may be provided utilizing a pair of protruding pins 30 which extends from one of the circuit members (e.g., module 24). These pins are aligned with and positioned within corresponding openings 56 within carrier member 62 and openings 36 (shown hidden) within the other circuit member 34. It should be understood that other means of alignment are possible, including the provision of pins extending from opposing surfaces of carrier member 62 for inversion within corresponding openings within the respective circuit members. To adjust for tolerancing, one of the openings 56 within connector 60 may be of an elongated configuration, forming a slot, for example.

Each contact member 16a–16c, 16f–16g is compressed during engagement to form the appropriate interconnection between corresponding pairs of conductive pads 28.

It is well known to those skilled in the art that the electrical impedance of a conductor relative to a voltage reference depends on the geometry and spacing of the conductor and reference, as well as the dimensions and materials of the insulative material between them. Through the choices of specific materials and dimensions for the components of contact members 16a–16g (FIGS. 2d, 2e, 3) and the diameter of openings 50, 51, 70, the electrical impedance of contact members 16a–16g may be controlled and optimized for specific applications. For example, the impedance of signal-carrying contact members 16a may be matched to the impedance of other components such as circuit members 24 and 34. This is especially important for the overall system electrical performance as semiconductor speeds continue to increase, and as semiconductor voltages and "noise budgets" continue to decrease. In one high speed memory subsystem the electrical impedance is 28 ohms. It is also possible to optimize power- and ground-carrying circuit members 16c–16g by using different dimensions and/or materials to obtain a much lower impedance, and therefore a much lower inductance for them. Both the signal and power electrical performance of systems may be further enhanced by the addition of components 72 (FIGS. 4a–4c) described below.

Figure 4A:
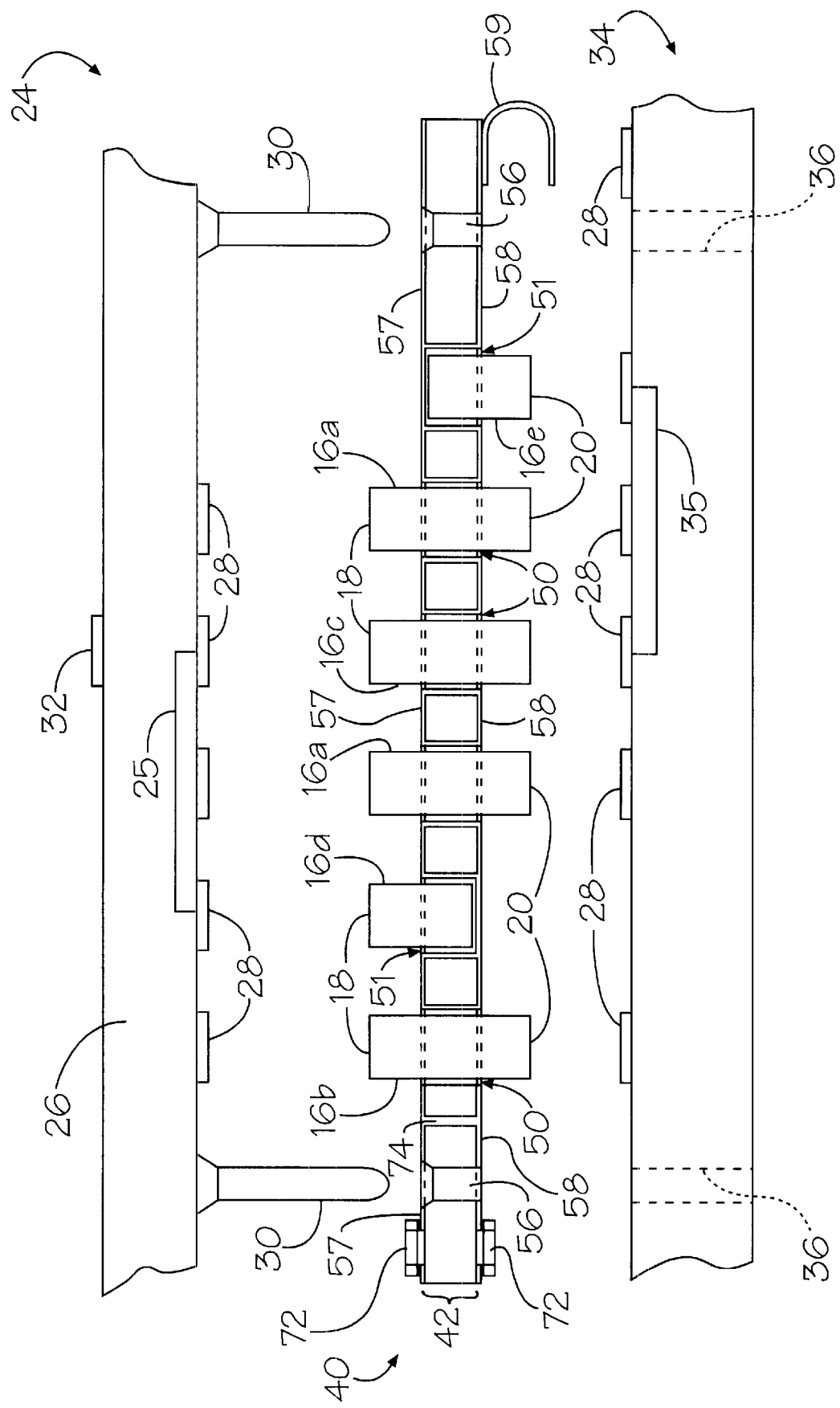
FIG. 4a is a side view of a carrier for a connector showing components directly connected to the carrier of the connector shown in FIG. 2e.
Figure 4B:
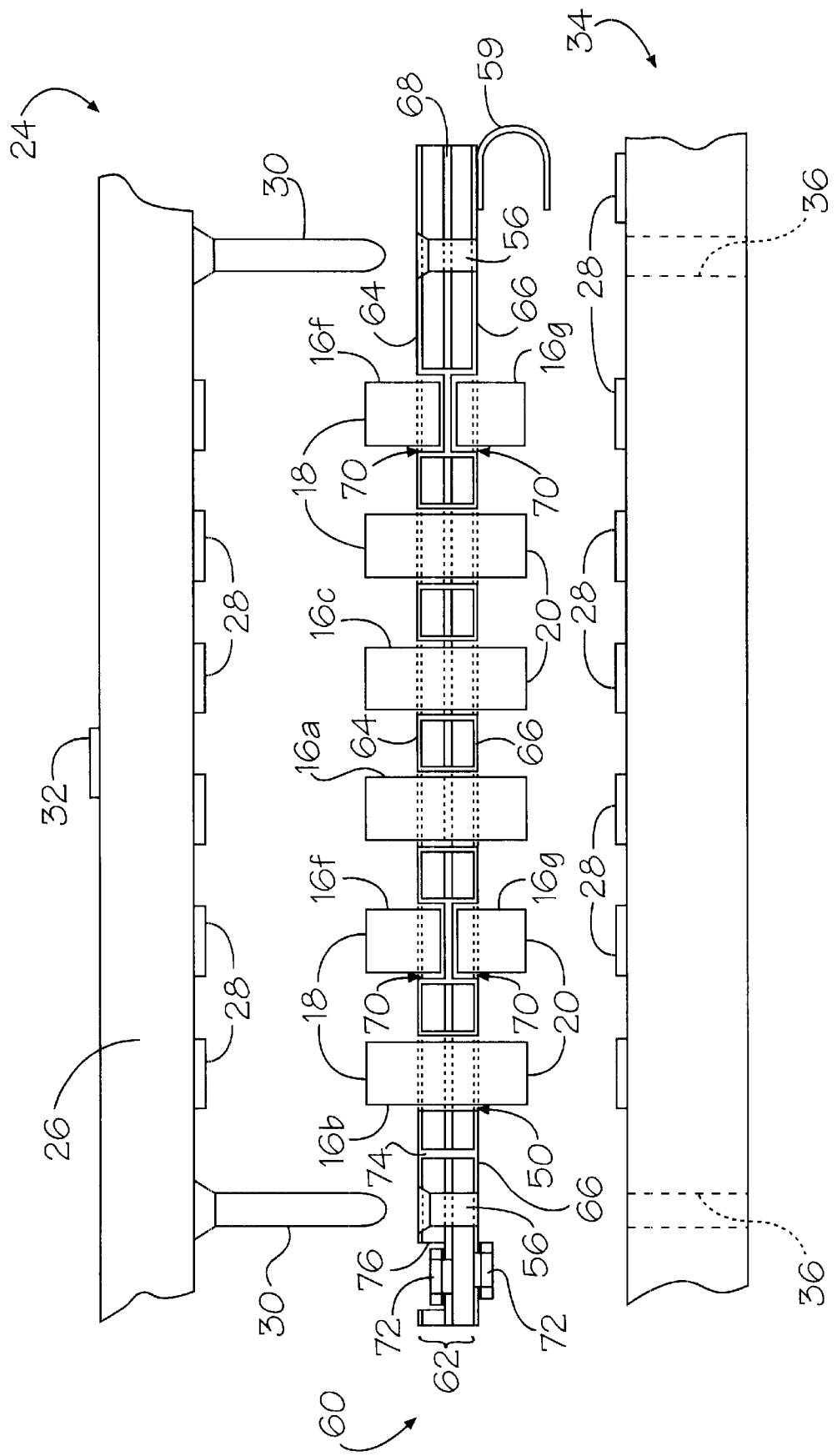
FIG. 4b is a side view of a carrier for a connector showing components directly connected to the carrier of the connector shown in FIG. 3.
Figure 4C:
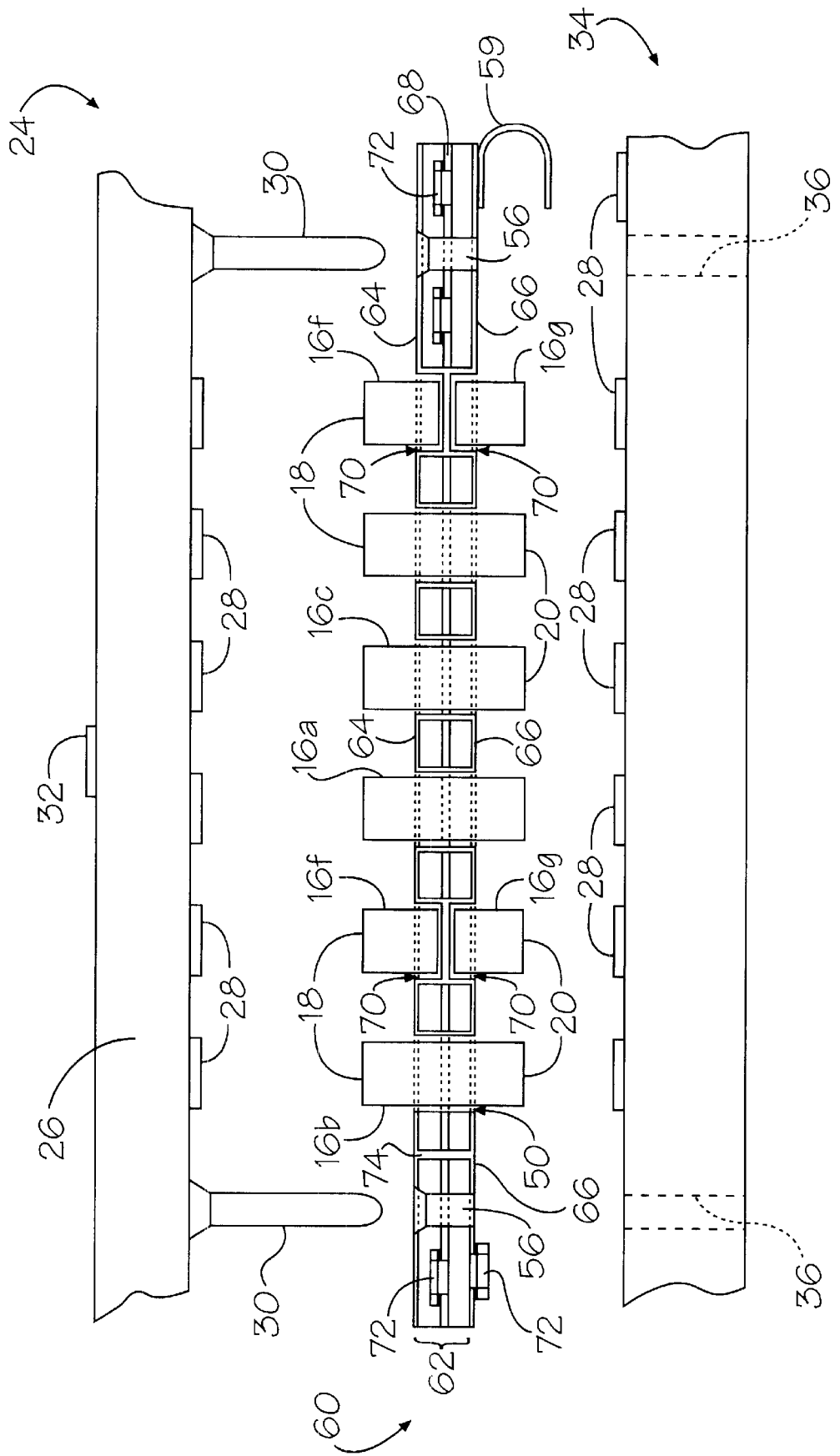
FIG. 4c is a side view of a carrier for a connector showing imbedded components within the carrier of the connector shown in FIG. 3.

Referring now to FIGS. 4a–4c, there are shown side views of carriers 42, 62 of connectors 40, 60, respectively, showing components directly connected to the carrier. One or more electronic components 72, such as terminating resistors and decoupling capacitors, may be included on carrier 42 or 62 to provide additional function and/or improved electrical performance. It is preferable that the components 72 (FIGS. 4a–4c) be of the surface mount variety due to their inherent lower profile.

Through technologies available today, components 72 (FIG. 4b) may also be imbedded within carrier 62 through a process such as forming cavities 76 for components 72 in carrier 62. Two alternate methods of internally forming components 72 (FIG. 4c) are (a) the screen printing of resistive material or conductive ink, and (b) the selective etching away of layers of conductive material, both part of the standard printed circuit manufacturing process that is well known by those skilled in the art. A thin layer of an alternate dielectric material can also be included between reference voltage layers such as ground and power, thereby creating imbedded capacitors for purposes such as decoupling within a carrier 62. Companies such as E.I. DuPont deNemours & Co. of Wilmington, Del. and Minnesota Mining and Manufacturing Company (3M) of St. Paul, Minn. make such dielectric materials.

Even though the interconnection of components 72 between different reference levels of shielding layers 57, 58 and/or to particular contact members 16a–16g is not fully shown in FIGS. 4a–4c, it should be readily apparent to those skilled in the art how these interconnections may be implemented for a specific application.

Although components 72 are located near the edge of carriers 42, 62 in FIGS. 4a–4c for disclosure purposes, it should be understood that components 72 may be better positioned in other locations on carriers 42, 62 in order to improve electrical performance, improve wirability, and facilitate manufacture. Also, while components 72 may be of the pin-in-hole variety (not shown), their use might be rather limited due to height constraints.

As the frequency of operation of a circuit increases, parasitic inductance degrades the effectiveness of decoupling capacitors to compensate for fluctuations in the supply voltage. One way to overcome this is to increase the numbers of decoupling capacitors but this is not always practical due to space limitations. An alternative that takes advantage of "building" capacitors as part of the standard printed circuit board manufacturing process is described hereinbelow.

Figure 4D:
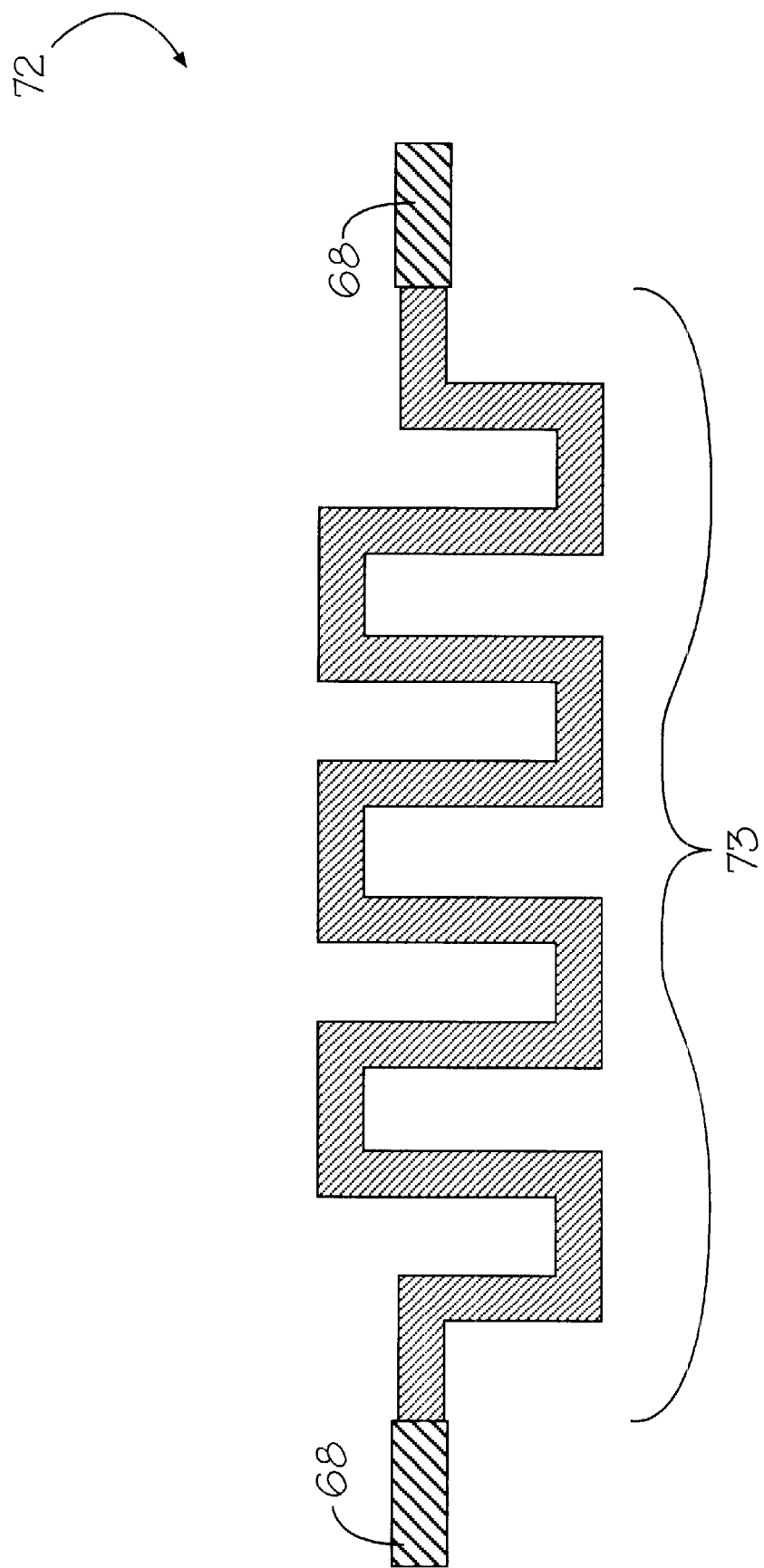
FIG. 4d is a top view of a component when implemented as an imbedded resistor within the carrier shown in FIG. 4c.

Referring now to FIG. 4d, there is shown a top view of a component 72 when implemented as an imbedded resistor as practiced by Ohmega Technologies, Inc. In this example, component 72 comprises a resistive material 73 that connects to one or more of the conductive metallic layers (e.g., shielding layer 68 in FIG. 4c). Although a serpentine pattern is shown for resistive material 73, many other shapes may be used in order to meet various design requirements. The resistive material 73 has well defined electrical properties that allow a range of resistor values to be built. However, it is typically difficult to hold tight tolerances (e.g., one percent) on embedded resistors.

Figure 4E:
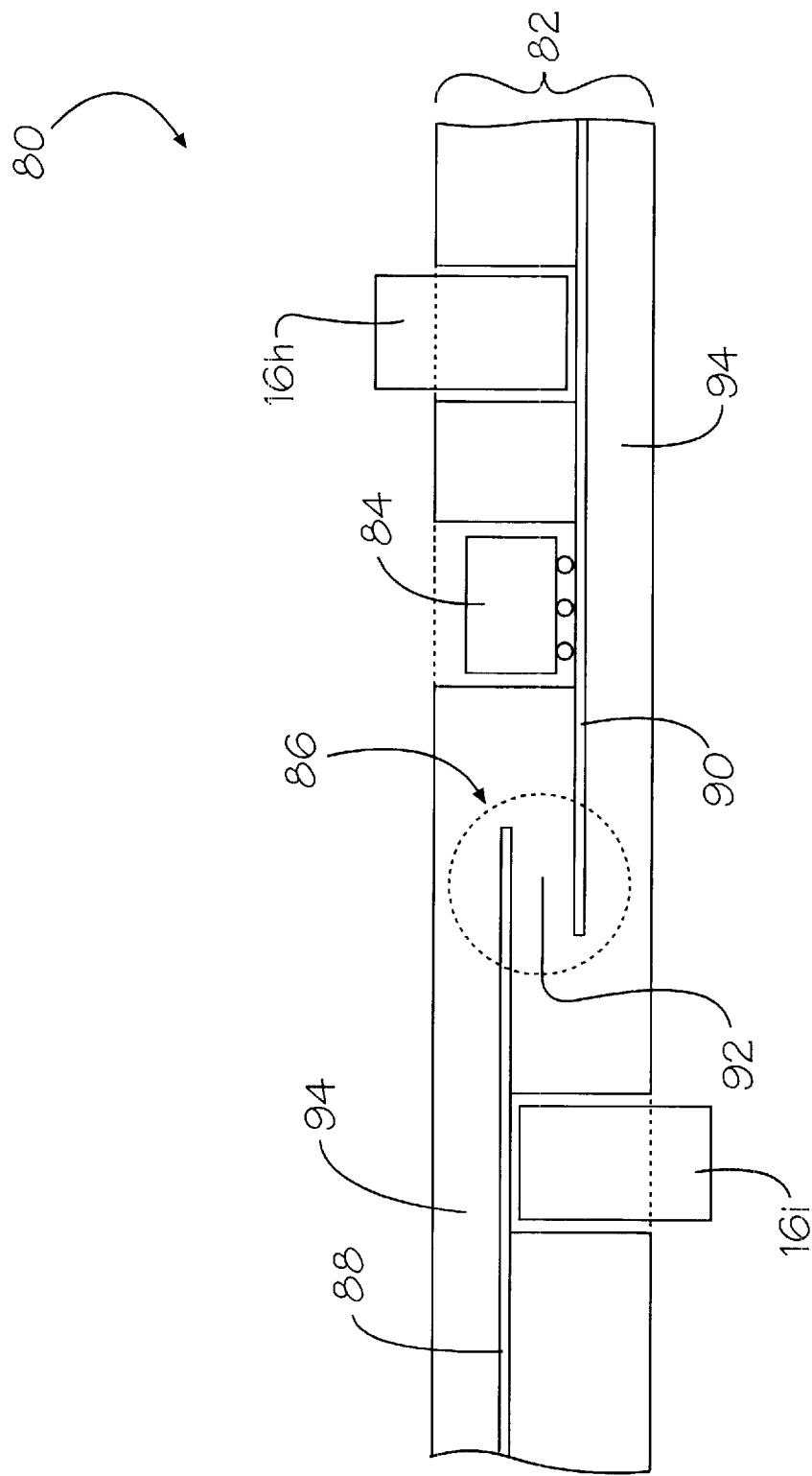
FIG. 4e is a side view of a carrier for a connector showing a different configuration of imbedded components within the carrier.

Referring now to FIG. 4e, there is shown a side view of carrier 82 of connector 80, showing a plurality of components 84, 86 imbedded within carrier 82. Components 84 preferably are surface mount-packaged passive devices such as terminating resistors and decoupling capacitors, or very thin active components.

A portion of internal conductive layers 88 and 90, when combined with the dielectric layer 92 between them, forms component 86, which, in this example, functions as a capacitor. Internal conductive layers 88, 90 also connect to contact members 16h, 16i to interconnect components 84, 86 to the rest of the system. Dielectric layer 92 may be of the same material as dielectric layers 94, but it may also be of a different material that optimizes the capacitance of component 86 for a given application. The thickness of dielectric layer 92 can also be varied to adjust the capacitance of component 86. It is also possible to stack additional conductive and dielectric layers to further increase the capacitance of component 86.

Depending on how internal conductive layers 88, 90 are connected, the formed capacitor 86 can function in several ways. If internal conductive layer 88 is connected to a reference voltage and internal layer 90 is connected to ground, then the capacitance of component 86 acts as a decoupling capacitor. If internal conductive layer 88 is connected to one signal and internal layer 90 is connected to another signal, then the capacitance of component 86 acts as a signal capacitor.

Since other modifications and changes varied to fit particular operating requirements and environments, including dimensions and material selections, will be apparent to those skilled in the art, this invention is not considered limited to the examples chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A connector assembly, comprising:

a) a shielded carrier comprising a substantially planar dielectric layer having an upper surface and a lower surface and having a substantially contiguous conductive shielding layer disposed on at least one of said surfaces, said carrier having a plurality of openings substantially completely therethrough, said openings being adapted to receive a contact member therein, and an electrical component operatively connected to said carrier and disposed in one location: on one of said surfaces of said carrier, and embedded within said carrier, wherein said carrier comprises a first, planar dielectric layer and a second, planar dielectric layer disposed substantially parallel to said first dielectric layer, said first and said second dielectric layers being separated by an intermediate retention layer disposed therebetween, wherein each opening of said plurality of openings has a first cross-sectional area in said first and second dielectric layers and a second, smaller cross-sectional area in said intermediate retention layer, wherein a portion of said intermediate retention layer, disposed between said first cross-sectional area and said smaller cross-sectional area within said plurality of openings, comprises a segmented portion; and b) a plurality of elongated, resilient electrically conductive contacts, each having a proximal and a distal end, each of said contacts being disposed, respectively, in one of said plurality of openings, said ends of said contacts each being adapted for abutting, pressing electrical contact with conductive surfaces adjacent thereto;

whereby a separable electrical connector is formed wherein said plurality of elongated contacts have sufficient length to exceed a height of said electrical component disposed on said surface of said carrier and said connector is selectively connectable to and separable from said adjacent conductive surfaces.

2. The connector assembly as recited in claim 1, wherein said at least one of said plurality of electrically conductive contacts has a controlled electrical impedance.

3. The connector assembly as recited in claim 1, further comprising commoning means electrically connected to said conductive shielding layer.

4. The connector assembly as recited in claim 1, wherein said electrical component comprises one from the group: resistor, capacitor, and semiconductor device.

5. The connector assembly as recited in claim 4, wherein said resistor comprises a serpentine shape.

6. The connector assembly as recited in claim 1, wherein said carrier further comprises electrically conductive layer disposed in an interior region thereof and substantially parallel to said upper and lower surfaces.

7. The connector assembly as recited in claim 6, wherein said carrier further comprises a via disposed therein.

8. The connector assembly as recited in claim 1, further comprising alignment means.

9. The connector assembly as recited in claim 8, wherein said alignment means is disposed in said carrier.

10. The connector assembly as recited in claim 1, wherein said plurality of openings comprises an electrically conductive opening.

11. The connector assembly as recited in claim 10, wherein said conductive shielding layer covers a terminus of said electrically conductive openings and is electrically connected thereto.

12. The connector assembly as recited in claim 11, wherein said electrical component is located on: a top surface of said carrier, and a bottom surface of said carrier.

13. The connector assembly as recited in claim 11, wherein said electrical component comprises a surface mount component.

14. The connector assembly as recited in claim 11, wherein said electrical component comprises a pin-in-hole component.

15. The connector assembly as recited in claim 1 further comprising an additional electrically conductive layer.

16. The connector assembly as recited in claim 15, wherein said reference voltage is at ground potential.

17. The connector assembly as recited in claim 15, wherein said additional electrically conductive layer and said shielding layers are electrically connected to a reference voltage forming a portion of a capacitor.

18. The connector assembly as recited in claim 15, wherein said reference voltage comprises a signal voltage and said capacitor comprises a signal capacitor.

19. The connector assembly as recited in claim 18, wherein said capacitor comprises a decoupling capacitor.

20. The connector assembly as recited in claim 18, wherein a capacitance of said capacitor may be varied by selecting the distance between said additional electrically conductive layers and said shielding layers which form said capacitor.

21. The connector assembly as recited in claim 18, wherein a capacitance of said capacitor may be varied by selecting the dielectric constant of said dielectric between said additional conductive plane and said shielding layers.

* * * * *